United States Patent [19]

Mizutani

[11] Patent Number: 5,633,721
[45] Date of Patent: May 27, 1997

[54] SURFACE POSITION DETECTION APPARATUS

[75] Inventor: Hideo Mizutani, Yokohama, Japan

[73] Assignee: Nikon Corporation, Tokyo, Japan

[21] Appl. No.: 643,765

[22] Filed: May 6, 1996

Related U.S. Application Data

[63] Continuation of Ser. No. 361,698, Dec. 22, 1994, abandoned, which is a continuation of Ser. No. 964,954, Oct. 22, 1992, abandoned.

[30] Foreign Application Priority Data

Oct. 30, 1991 [JP] Japan ............... 3-311758

[51] Int. Cl.$^6$ ......................... G01B 11/00
[52] U.S. Cl. .................... 356/401; 250/548
[58] Field of Search ................ 356/399–401; 250/548, 559.3; 355/43, 53

[56] References Cited

U.S. PATENT DOCUMENTS

| | | | |
|---|---|---|---|
| 4,687,322 | 8/1987 | Tanimoto et al. | 355/55 |
| 5,076,698 | 12/1991 | Smith et al. | 356/376 |
| 5,118,957 | 6/1992 | Kawashima et al. | 250/561 |
| 5,218,415 | 6/1993 | Kawashima et al. | 356/375 X |
| 5,272,501 | 12/1993 | Nishi et al. | 356/401 X |

FOREIGN PATENT DOCUMENTS 1-253603   10/1989   Japan .

*Primary Examiner*—K. Hantis
*Attorney, Agent, or Firm*—Shapiro and Shapiro

[57] ABSTRACT

A surface position detection apparatus for detecting a surface position on a surface to be detected, comprises a projection pattern formed on a first surface, a projection optical system for projecting the pattern from an oblique direction onto the surface to be detected, a condensing optical system for condensing a light beam reflected by the surface to be detected, and forming an image of the pattern on a second surface, and a detector for photoelectrically detecting the image of the pattern. The first surface and the surface to be detected are arranged to satisfy a Scheimpflug condition in association with a principal plane of the projection optical system. The surface to be detected and the second surface are arranged to satisfy a Scheimpflug condition in association with a principal plane of the condensing optical system.

26 Claims, 8 Drawing Sheets

SURFACE POSITION DETECTION APPARATUS

This is a continuation of application Ser. No. 08/361,698 filed Dec. 22, 1994, which is a continuation of application Ser. No. 07/964,954 filed Oct. 22, 1992, both now abandoned.

BACKGROUND OF THE INVENTION

1. Field of the Invention

The present invention relates to a surface position detection apparatus for detecting a position of a surface to be detected.

2. Related Background Art

In a semiconductor exposure apparatus for transferring a circuit pattern formed on a reticle onto a wafer through a projection lens, the focal depth of the projection lens is relatively small, and a three-dimensional pattern is often locally present on the wafer. For this reason, a defocused state with respect to the projection lens must be compensated for depending on each exposure region on the wafer. As a detection apparatus for detecting the position of the projection lens in the optical axis direction in this case, for example, U.S. Pat. No. 4,687,322 discloses an oblique incident type auto-focus sensor for obliquely projecting a slit image onto a surface to be detected of, e.g., a wafer. In this example, when the surface to be detected is vertically shifted, the position of the slit on the surface to be detected is shifted in a direction perpendicular to the optical axis of an oblique incident optical system. Thus, the position of the surface to be detected in the optical axis direction can be detected by measuring this shift amount.

For example, Japanese Patent Application Laid-Open No. 1-253603 discloses a surface position detection apparatus, which obliquely radiates three or more light beams onto a surface to be detected through a projection lens system having a common portion in order to simultaneously measure the positions of a plurality of points on the surface to be detected. In this example, a compensation optical system is built in, so that a plane including light sources of the three or more light beams is perpendicular to the optical axis of the common projection lens.

However, in the conventional detection apparatus, it is impossible to simultaneously detect vertical positions in a region over a wide range on a surface to be detected.

In this case, according to the apparatus disclosed in Japanese Patent Application Laid-Open No. 1-253603, when the number of obliquely incident light beams is increased to increase the density, the vertical positions in a region over a wide range can be detected. However, this makes the overall optical system including the compensation optical system complicated, and adjacent light beams undesirably have some interval therebetween.

In recent years, along with an increase in integration degree of LSIs, it is demanded to transfer micropatterns onto exposure regions (shot regions) on a wafer. In order to meet this demand, the numerical aperture (N.A.) of a projection lens for transferring an image of a circuit pattern onto a wafer is increased. For this reason, since the focal depth of the projection lens becomes small, it is demanded to precisely and reliably locate each exposure region within the focal depth of the projection lens.

Furthermore, when a plurality of LSI chips are simultaneously exposed, or when the size of an LSI chip to be exposed (the size of an exposure region) is to be changed, light for position detection cannot be radiated on a proper position on a surface to be detected in this state. In order to perform precise position detection, a position to be irradiated with light on an exposure region must be changed. In order to perform precise position detection with the conventional detection apparatus under these circumstances, a plurality of positions of each exposure region on the wafer must be detected. However, this makes an optical system complicated.

A stage which carries the wafer may be sequentially moved to a required detection position by projecting slit light from the detection apparatus onto the required detection position. However, the time required for position detection is prolonged, and the throughput is decreased.

SUMMARY OF THE INVENTION

It is, therefore, an object of the present invention to provide a surface position detection apparatus, which can simultaneously detect the distribution of vertical positions on a wide exposure region, and has a simple optical system.

In order to achieve the above object, according to one aspect of the present invention, a surface position detection apparatus for detecting a surface position on a surface to be detected, comprises:

a projection pattern formed on a first surface, a projection optical system for projecting the pattern from an oblique direction onto the surface to be detected, a condensing optical system for condensing a light beam reflected by the surface to be detected, and forming an image of the pattern on a second surface, and a detector for photoelectrically detecting the image of the pattern, the first surface and the surface to be detected are arranged to satisfy a scheimplug condition in association with a principal plane of the projection optical system, and the surface to be detected and the second surface are arranged to satisfy a Scheimpflug condition in association with a principal plane of the projection optical system.

In the present invention, if, for example, planes A and B satisfy a Scheimpflug condition in association with an optical system for imaging a pattern on the plane A onto the plane B, this has the following meaning. That is, when an intersection between the extending line of the plane A and the object-side principal plane of the optical system is represented by H, and an intersection between the extending line of the plane B and the image-side principal plane of the optical system is represented by H' in the meridional section of the optical system, the distance between the intersection H and the optical axis of the optical system is equal to the distance between the intersection H' and the optical axis. When the Scheimpflug condition is satisfied, a so-called relation of swung or tilted image formation is satisfied, and a light beam emerging from an arbitrary point on the plane A is focused on the corresponding one point on the plane B. Therefore, images of points on the entire plane A are formed on the plane B.

According to the present invention, since the first surface and a surface to be detected satisfy the so-called relation of swung or tilted image formation, and the surface to be detected and the second surface satisfy the relation of swung or tilted image formation, points on the entire surface to be detected are formed on the second surface. In this case, since the projection optical system projects a projection pattern in an oblique direction with respect to the surface to be detected, if a three-dimensional pattern is locally present on the surface to be detected, an image, corresponding to the three-dimensional pattern, on the second surface is distorted. Upon detection of the distorted image, the vertical positions on the entire surface to be detected can be detected.

Since the surface to be detected and the second surface satisfy the relation of swung or tilted image formation, a horizontal shift amount on the second surface due to a vertical displacement of the surface to be detected becomes large as compared to the magnification relationship between the surfaces.

This will be quantitatively described below.

For example, as shown in FIG. 1, when an incident angle of light from a projection optical system with respect to the surface to be detected is represented by θ, a vertical displacement of the surface to be detected is represented by z, and an image formation magnification along a swung or tilted image formation plane from the surface to be detected to the second surface is represented by β', a horizontal shift amount $y_1$ on the second surface can be given by:

$$y_1 = 2 \cdot \beta' \cdot \tan\theta \cdot z \quad (1)$$

When a lateral magnification as a magnification in a direction perpendicular to the optical axis between the surface to be detected and the second surface is represented by β, the following relation is satisfied based on the Scheimpflug condition:

$$\beta' = (\beta^2 \cos^2\theta + \beta^4 \sin^2\theta)^{1/2} \quad (2)$$

On the other hand, in the conventional technique disclosed in, e.g., U.S. Pat. No. 4,687,322, since a horizontal shift is detected in a direction perpendicular to the optical axis, a horizontal shift amount $y_2$ to be detected is given by:

$$y_2 = 2 \cdot \beta \sin\theta \cdot z \quad (3)$$

Upon comparison between equations (1) and (3), when the incident angle θ is large, the horizontal shift amount $y_1$ given by equation (1) obtained when the relation of swung or tilted image formation is satisfied is larger than the horizontal shift amount $y_2$. For the sake of simplicity, if β=1, β'=1 is satisfied from equation (2), and the horizontal shift amounts $y_1$ and $y_2$ are respectively proportional to tanθ and sinθ. For example, when θ=80°, $y_1$=11.3z according to equation (1), and $y_2$=2.0z according to equation (3). Therefore, the horizontal shift amount obtained when the relation of swung or tilted image formation is satisfied becomes larger by 5.7 times than that obtained when it is not satisfied, and the detection sensitivity and precision in the vertical direction of the surface to be detected can be improved.

Preferably, the surface position detection apparatus according to the present invention is arranged on the second surface, and includes a deviation means for deviating a light beam emerging from a focusing optical system.

When the incident angle θ is large, the incident angle of a light beam incident on the second surface is also large. For example, when the light-receiving surface of a detector is arranged on the second surface, a surface reflection, an eclipse of a light beam, or the like occurs on the light-receiving surface, and the light-receiving amount on the light-receiving surface may be considerably decreased. In this case, the surface position detection apparatus according to the present invention includes a deviation means, arranged on the second surface, for deviating a light beam emerging from the condensing optical system. Since the deviation means deviates a light beam reaching the light-receiving surface so as to decrease the incident angle on the light-receiving surface, the decrease in light-receiving amount of the detector can be prevented. Therefore, the incident angle of a pattern to be projected onto the surface to be detected can be further increased, and position detection with higher precision can be performed.

Other objects, features, and effects of the present invention will become sufficiently apparent from the following detailed description taken in conjunction with the accompanying drawings.

DESCRIPTION OF THE PREFERRED EMBODIMENTS

An embodiment according to one aspect of a surface position detection apparatus of the present invention will be described in detail below with reference to the accompanying drawings.

Figure 1:
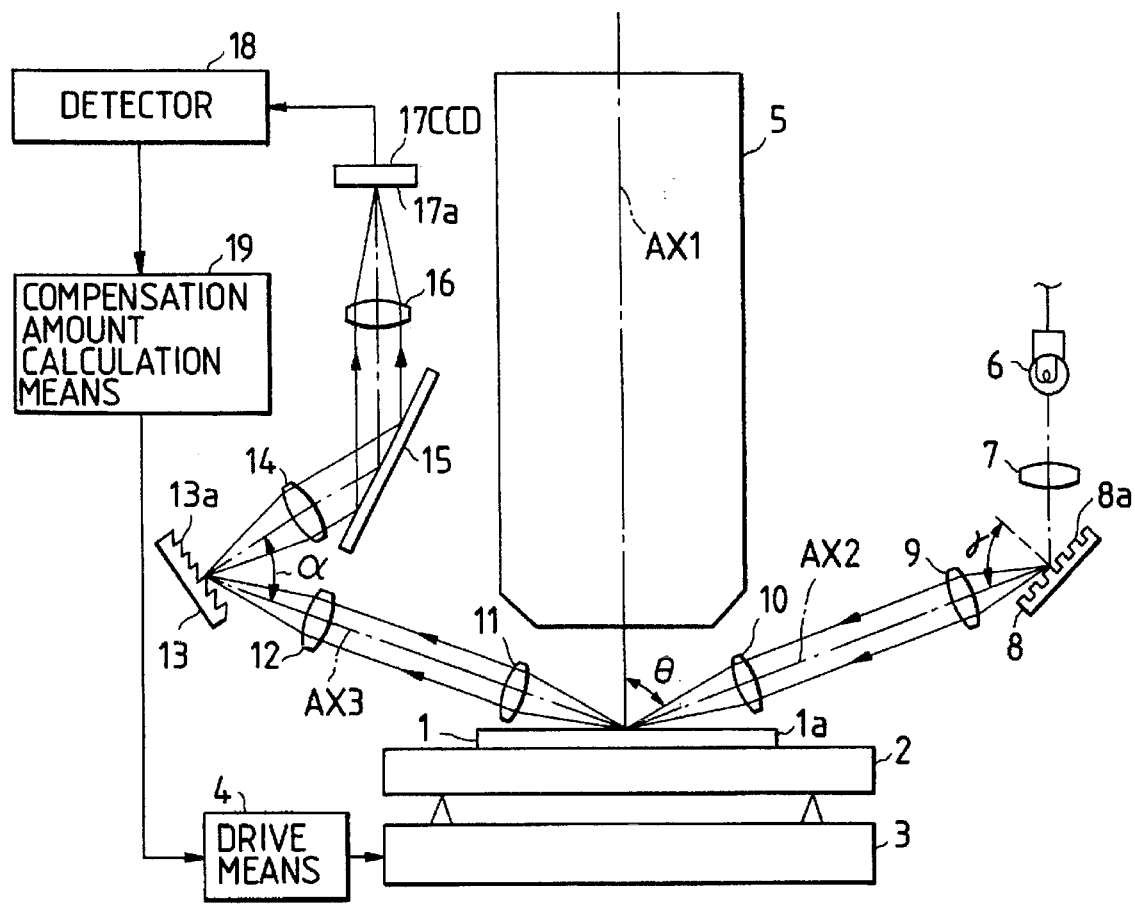
FIG. 1 is a diagram showing main part of a surface position detection apparatus according to one aspect of the present invention.

FIG. 1 is a diagram showing an embodiment wherein the surface position detection apparatus according to the present invention is applied to a semiconductor exposure apparatus.

FIG. 1 shows main part of the semiconductor exposure apparatus of this embodiment. In FIG. 1, an exposure surface of a wafer 1 serves as a surface 1a to be detected. The wafer 1 is placed on a holder 2, and the holder 2 is supported on a holding mechanism 3 at, e.g., three support points. The holding mechanism 3 is driven by a drive means 4. A projection lens 5 is located above the wafer 1, and transfers a pattern on a reticle (not shown) onto the exposure surface of the wafer 1. When the holding mechanism 3 is driven through the drive means 4, the holder 2 undergoes a translation and a micro-rotation within a plane perpendicular to an optical axis AX1 of the projection lens 5, and a movement in a direction (focusing direction) parallel to the optical axis AX1. Furthermore, when the holding mechanism 3 moves, e.g., two out of the three support points in the vertical direction according to a command from the drive means 4, leveling of the holder 2 is attained.

In order to satisfactorily transfer a circuit pattern on the reticle onto the surface 1a to be detected of the wafer 1, the current exposure region of the surface 1a to be detected must be set within a range of the width of the focal depth with respect to the image formation plane of the projection lens in units of exposure shots. For this purpose, the position, in the direction of the optical axis AX1 of the projection lens 5, of each point on the current exposure region of the surface 1a to be detected is precisely detected, and thereafter, the leveling and movement in the focusing direction of the holder 2 are performed to set the current exposure region within the range of the width of the focal depth. In a conventional apparatus, since the position, in the direction of the optical axis AX1, of each point on the current exposure region of the surface 1a to be detected is detected by, e.g., an individual optical system, the overall optical system is complicated, and it is difficult to detect many points. In this embodiment, the positions, in the direction of the optical axis AX1, on the entire current exposure region can be detected simultaneously by a common optical system. An optical system and a processing system for realizing this detection will be described below.

In FIG. 1, an optical system includes a light source 6, a condenser lens 7, and a reflection type phase grating 8. Three-dimensional phase gratings are formed at a pitch Q1 on a grating formation surface 8a of the reflection type phase grating 8 in a direction parallel to the plane of FIG. 1. In order to eliminate the influence of interference occurring when the surface 1a to be detected of the wafer 1 is coated with, e.g., a resist thin film, the light source 6 preferably comprises a white light source. In this case, the light source 6 may comprise, e.g., a light-emitting diode for emitting light of a wavelength range having a low sensitivity to the resist film. An illumination light beam emitted from the light source 6 is converted into a substantially collimated light beam through the condenser lens 7, and the grating formation surface 8a of the phase grating 8 is illuminated with the substantially collimated light beam.

The optical system also includes a condenser lens 9 and a projection objective lens 10. The condenser lens 9 and the projection objective lens 10 constitute a projection optical system, and an optical axis AX2 of this projection optical system is set to cross the optical axis AX1 of the projection lens 5 at an angle θ. Reflected light (including diffracted light) from the grating formation surface 8a is focused onto the surface 1a to be detected of the wafer 1 by the projection optical system. In this case, the surface 1a to be detected and the grating formation surface 8a are set to satisfy the Scheimpflug condition in association with the projection optical system in a state wherein the surface 1a to be detected coincides with the image formation plane of the projection lens 5. Therefore, in this state, the image of the grating pattern on the grating formation surface 8a is precisely formed on the entire surface 1a to be detected.

Figure 2:
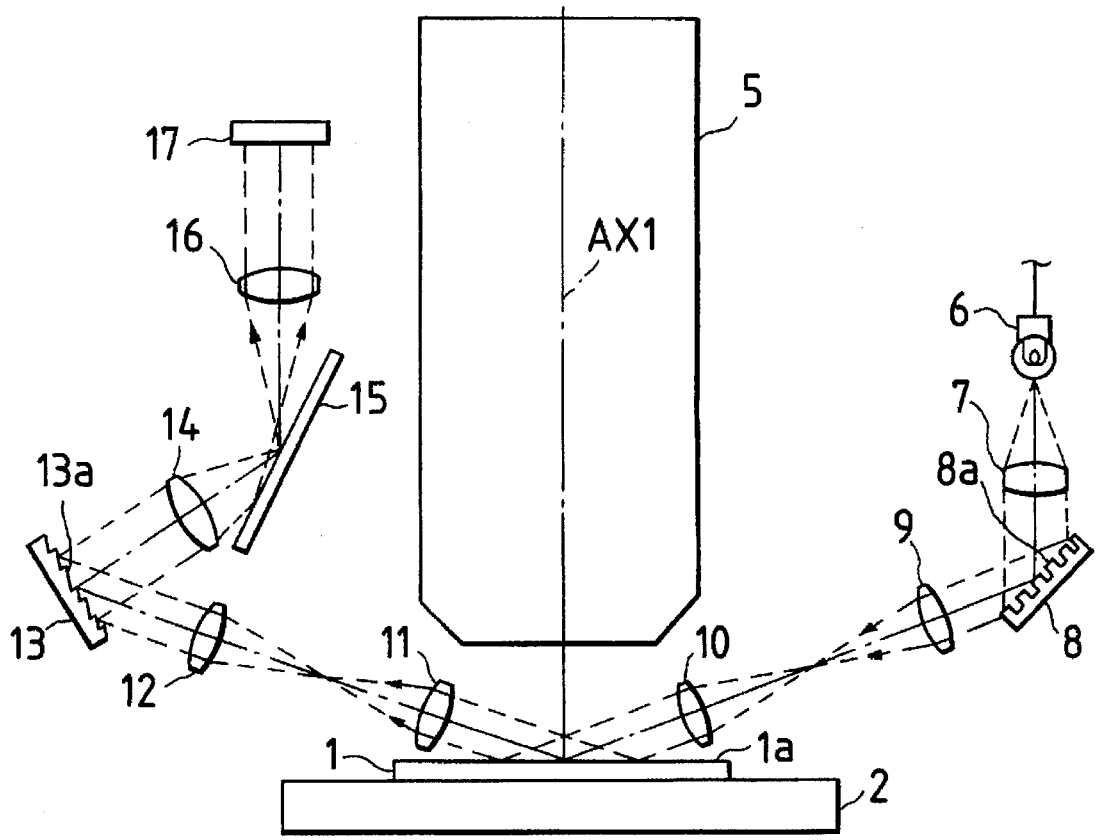
FIG. 2 is an optical path diagram showing the fact that an optical system of the surface position detection apparatus shown in FIG. 1 is a two-side telecentric system.

As is apparent from an optical path indicated by dotted lines in FIG. 2, the projection optical system constituted by the condenser lens 9 and the projection objective lens 10 constitutes a so-called both side (object side and image side) telecentric optical system, and each point on the grating formation surface 8a and a conjugate point on the surface 1a to be detected have an equal magnification on the entire surface. Therefore, in this embodiment, since the grating pattern on the grating formation surface 8a is defined by gratings at equal intervals to have a direction perpendicular to the plane of FIG. 1 as a longitudinal direction, an image projected onto the surface 1a to be detected includes gratings at equal intervals having the direction perpendicular to the plane of FIG. 1 as the longitudinal direction.

In this embodiment, some optical system constitutes both side telecentric optical system, and this has the following meaning.

That is, principal ray that enter through some optical system, is parallel to the optical axis of some optical system, and principal ray that emerging from some optical system, is parallel to the optical axis of some optical system.

Referring back to FIG. 1, a light-receiving objective lens 11 and a condenser lens (imaging lens) 12 constitute a condensing optical system. An optical axis AX3 of the condensing optical system is axially symmetrical with the optical axis AX2 of the projection optical system about the optical axis AX1 of the projection lens. A three-dimensional phase type grating pattern is formed on a diffraction grating formation surface 13a of a swing & tilting correction diffraction grating 13 at a pitch Q2 in a direction parallel to the plane of FIG. 1. The grating pattern has a predetermined blaze angle, as will be described later. The condensing optical system condenses reflected light from the surface 1a to be detected onto the diffraction grating formation surface 13a.

In this case, the surface 1a to be detected and the diffraction grating formation surface 13a are set to satisfy the Scheimpflug condition in association with the condensing optical system in a state wherein the surface 1a to be detected coincides with the image formation plane of the projection lens 5. Therefore, in this state, the image of the grating pattern on the surface 1a to be detected is precisely re-formed on the entire diffraction grating formation surface 13a. As is apparent from an optical path indicated by dotted lines in FIG. 2, the condensing optical system constituted by the light-receiving objective lens 11 and the condenser lens 12 also constitutes a both side telecentric optical system, and each point on the surface 1a to be detected and a conjugate point on the diffraction grating formation surface 13a have an equal magnification on the entire surface. Therefore, in a state wherein the surface 1a to be detected coincides with the image formation plane of the projection lens 5, an image projected onto the diffraction grating formation surface 13a also includes gratings at equal intervals having the direction perpendicular to the plane of FIG. 1 as the longitudinal direction.

More specifically, in the state wherein the surface 1a to be detected coincides with the image formation plane of the projection lens 5, the grating formation surface 8a, the surface 1a to be detected, and the diffraction grating formation surface 13a have a relationship satisfying the Scheimpflug condition, and have an equal magnification on their entire surfaces.

Referring back to FIG. 1, light incident on the swing & tilting correction diffraction grating 13 is reflected by diffraction. In this case, the pitch of the diffraction grating 13 is determined, so that the principal ray of the incident light is reflected to be substantially parallel to the direction normal to the diffraction grating formation surface 13a. Reflected light from the diffraction grating formation surface 13a is focused on a light-receiving surface 17a of a two-dimensional charge-coupled image pickup device (CCD) 17 through a lens 14, a plane mirror 15, and a lens 16. The image of the grating pattern on the diffraction grating formation surface 13a is formed on the light-receiving surface 17a. A relay optical system constituted by the lenses 14 and 16 is also a both side telecentric optical system. The image formed on the light-receiving surface 17a is obtained by relaying twice an image on the surface 1a to be detected of the pattern on the grating formation surface 8a of the reflection type phase grating 8. In other words, the image formed on the light-receiving surface 17a is an image obtained by re-forming the image of the pattern projected onto the surface 1a to be detected.

In this case, since the principal ray of the reflected light from the diffraction grating 13 is substantially perpendicular to the diffraction grating formation surface 13a, the principal ray of the light beam incident on the two-dimensional CCD 17 is also substantially perpendicular to the light-receiving surface 17a. Since the image of the pattern projected onto the surface 1a to be detected is re-formed on the light-receiving surface 17a, the image of the grating pattern on the light-receiving surface 17a is horizontally shifted by the vertical displacement of the surface 1a to be detected along the optical axis AX1 of the projection lens 5. When this horizontal shift amount is measured, the surface position on the surface 1a to be detected in the direction of the optical axis AX1 can be measured.

An image pickup signal output from the two-dimensional CCD 17 is supplied to a detector 18. The detector 18 processes the image pickup signal to obtain the pattern of the image on the light-receiving surface 17a, and supplies the pattern information to a compensation amount calculation means 19. The compensation amount calculation means 19 calculates a shift amount between the current exposure region of the surface 1a to be detected and the image formation plane of the projection lens 5 on the basis of the pattern information, and sets the shift amount of the entire exposure region to fall within the focal depth through the drive means 4.

Then, the horizontal shift amount of the image of the grating pattern on the light-receiving surface 17a of the two-dimensional CCD 17, when the displacement of the surface 1a to be detected in the direction of the optical axis AX1 is represented by z, is represented by y, and the horizontal shift amount y is calculated. In this case, when the incident angle of the principal ray of the incident light on the surface 1a to be detected is represented by $\theta$, the lateral magnification of the focusing optical system constituted by the lenses 11 and 12 is represented by $\beta$, the magnification along a swung or tilted image formation plane from the surface 1a to be detected to the diffraction grating formation surface 13a is represented by $\beta'$, and the lateral magnification of the relay optical system constituted by the lenses 14 and 16 is represented by $\beta''$, the horizontal shift amount y is given by the following equation from the above-mentioned equations (1) and (2):

$$y=2\cdot\beta''\cdot\beta'\cdot\tan\theta\cdot z=2\cdot\beta''(\beta^2 \sin^2\theta+\beta^4 \sin^4\theta/\cos^2\theta)^{1/2}\cdot z \quad (4)$$

The projection optical system constituted by the lenses 9 and 10, and the condensing optical system constituted by the lenses 11 and 12 respectively satisfy the Scheimpflug condition. Therefore, when an angle defined between the normal and reflected light of the reflection type phase grating 8 is represented by $\gamma$, an angle defined between the incident light and the normal (reflected light) of the swing & tilting correction diffraction grating 13 is represented by $\alpha$ (the angle $\alpha$ is equal to the incident angle of the principal ray onto the diffraction grating 13), the lateral magnification of the projection optical system constituted by the lenses 9 and 10 (the lateral magnification of the surface 1a to be detected on the reflection type phase grating 8) is represented by $\beta_4$, and the lateral magnification of the condensing optical system constituted by the lenses 11 and 12 is represented by $\beta$, the following relations are satisfied:

$$\tan\gamma=\beta_4\cdot\tan\theta \quad (5)$$

$$\tan\alpha=\beta\cdot\tan\theta \quad (6)$$

The function of the swing & tilting correction diffraction grating 13 will be described below. For example, when the lateral magnification $\beta$ of the condensing optical system is 0.5, and the incident angle $\theta$ is 85°, $\alpha$=80.1° from equation (6). In the case of such a large incident angle, if a CCD is directly arranged in place of the diffraction grating 13, the incident light amount is considerably decreased. This is because light incident on a photoelectric conversion portion of the CCD is eclipsed by a reading circuit portion around the photoelectric conversion portion. In addition, the surface reflection of window glass of the photoelectric conversion portion and a package of the CCD is considerable, and light cannot be effectively incident on the CCD. Thus, an optical element for decreasing the incident angle of light onto the CCD is preferably arranged. In this embodiment, this function is realized by using 1st-order diffracted light of the swing & tilting correction diffraction grating 13.

When the diffraction angle of the 1st-order diffracted light of the diffraction grating 13 is represented by $\omega$, and the wavelength of incident light is represented by $\lambda$, the following equation is established:

$$\sin\alpha-\sin\omega=\lambda/Q2 \quad (7)$$

For example, when the incident angle $\alpha$=80°, the wavelength $\lambda$=800 nm, and the grating pitch $Q2$=0.833 μm (1,200 gratings/mm), $\omega$=1.4°, and the principal ray of the diffracted light is reflected in a direction substantially perpendicular to the diffraction grating formation surface 13a of the diffraction grating 13. Since the grating pattern is formed on the diffraction grating formation surface 13a, when this surface is relayed onto the two-dimensional CCD 17 by the relay optical system constituted by the lenses 14 and 16, the incident angle of the principal ray of the incident light beam onto the light-receiving surface 17a of the two-dimensional CCD 17 becomes almost zero, and the above-mentioned problem of the decrease in light-receiving amount can be solved.

Figure 3A:
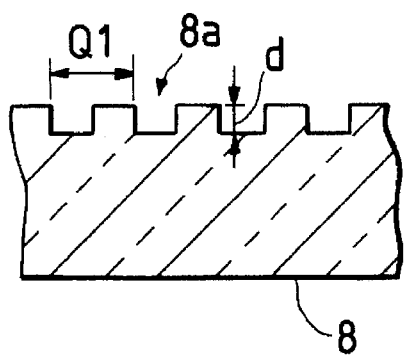
FIG. 3A is a partial sectional view of a reflection type phase grating.
Figure 3B:
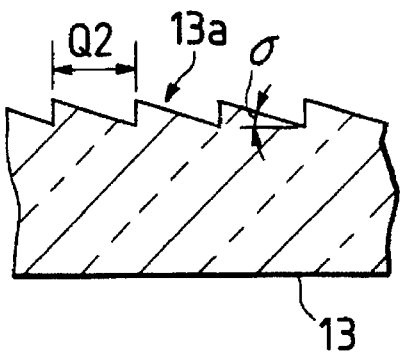
FIG. 3B is a partial sectional view of a swing & tilting correction diffraction grating.

When the blaze angle of the diffraction grating 13 is selected to increase the intensity of the diffracted light, the light-receiving amount can be increased. More specifically, FIG. 3B is a partial sectional view of the diffraction grating 13. In FIG. 3B, an angle $\delta$ formed between the reflection surface of the grating at the pitch Q2 and the diffraction grating formation surface 13a is the blaze angle. The direction of the 1st-order diffracted light by the grating is determined by the pitch Q2, and in this embodiment, the pitch Q2 is determined so that the diffracted light is reflected in a direction substantially perpendicular to the diffraction grating formation surface 13a. Furthermore, when the blaze angle δ is selected, so that the principal ray of the incident light and the principal ray of the 1st-order diffracted light have a specular reflection relationship therebetween with respect to the reflection surface of the grating, the intensity of the diffracted light can be maximized.

When the reflection type phase grating 8 is designed to have a phase for eliminating 0th-order light as regularly reflected light, the numerical aperture (N.A.) of the projection optical system and the condensing optical system can be decreased. For example, when the lateral magnification $\beta_4$ of the projection optical system constituted by the lenses 9 and 10 (FIG. 1) is 0.5, and the incident angle θ is 85°, γ=80.1° from equation (5). When the sectional shape of the reflection type phase grating 8 is designed to have a three-dimensional pattern (uneven shaped pattern) having the pitch Q1 and a groove depth d, no 0th-order light is generated when the groove depth d is given by the following equation:

$$d = m \cdot \lambda / (4 \cos \gamma) \qquad (8)$$

where m is an integer, and λ is the wavelength.

For example, when λ=800 nm, γ=80.1°, and m=1, no 0th-order light is generated when d=1.16 μm.

The detailed numerical values of the optical system shown in FIG. 1 will be exemplified below. Assume that the incident angle θ=85°. If the pitch Q1 of the gratings on the grating formation surface 8a is 126.4 μm, and the lateral magnification $\beta_4$ of the projection optical system constituted by the lenses 9 and 10 is ×0.5, the magnification from the grating formation surface 8a to the surface 1a to be detected is ×3.96 from equation (2). Therefore, images (fringes) of the gratings at a pitch of 500 μm are formed on the surface 1a to be detected. If the lateral magnification β of the condensing optical system constituted by the lenses 11 and 12 is ×0.5 as in the projection optical system, a pattern 1/3.96 times the pattern on the surface 1a to be detected is formed on the diffraction grating formation surface 13a of the swing & tilting correction diffraction grating 13 by the light beam reflected by the surface 1a to be detected, and the pitch of fringes formed on the diffraction grating formation surface 13a is 126.4 μm.

The incident angle α onto the diffraction grating 13 is 80.1°, and if the pitch of the gratings on the diffraction grating formation surface 13a is selected to be 1,200 gratings/mm, the direction of the 1st-order diffracted light is substantially perpendicular to the formation surface 13a. The blaze angle δ (see FIG. 3B) of the gratings on the formation surface 13a is about 40°.

If the magnification of the relay optical system constituted by the lenses 14 and 16 is set to be an equal magnification, the pitch of fringes formed on the light-receiving surface 17a of the two-dimensional CCD 17 is 126.4 μm. The horizontal shift amount y of the fringes on the light-receiving surface 17a with respect to the displacement z of the surface 1a to be detected in the direction of the optical axis AX1 is as follows from equation (3):

$$y = 5.78z \qquad (9)$$

In this case, since the lateral magnification β of the condensing optical system constituted by the lenses 11 and 12 is 0.5, and the incident angle θ is 85°, the magnification β' along a swung or tilted image formation plane from the surface 1a to be detected to the diffraction grating formation surface 13a is 0.253 from equation (2). Therefore, if a target detection region on the surface 1a to be detected is 20 mm², the area of the light-receiving surface 17a of the two-dimensional CCD 17 need only be 5.1 mm×10 mm. If the detection precision of the surface 1a to be detected in the direction of the optical axis AX1 is 0.1 μm, the two-dimensional CCD 17 need only detect a position shift amount of about 0.6 μm from equation (9).

Figure 4A:
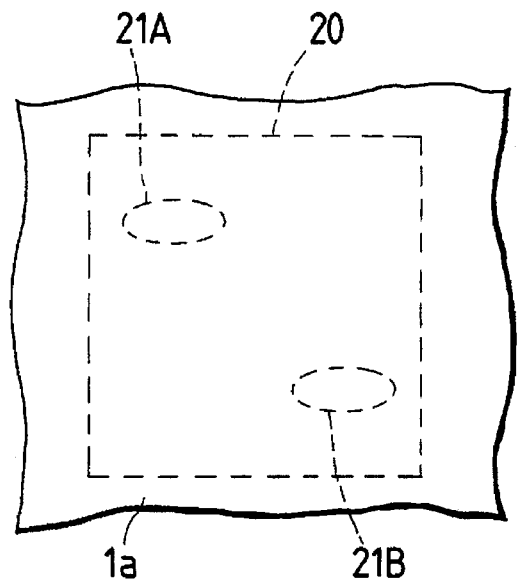
FIG. 4A is a partial plan view of a surface to be detected.
Figure 4B:
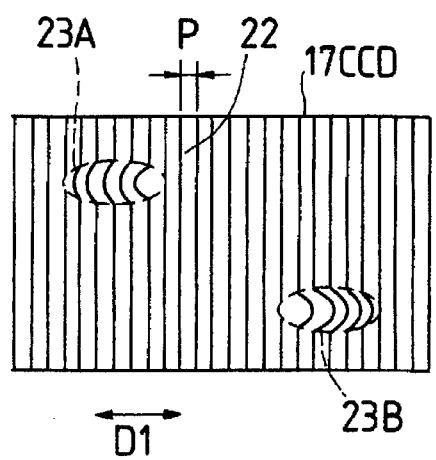
FIG. 4B is a chart showing a state of an image on a light-receiving surface of a two-dimensional CCD.

On the light-receiving surface of the two-dimensional CCD 17, as shown in FIG. 4B, fringes 22 at a pitch P are formed on a region corresponding to the region of the surface 1a to be detected coinciding with the image formation plane of the projection lens. In this case, if a recessed region 21A and a projecting region 21B are present in the direction of the optical axis AX1 in a target detection region 20 on the surface 1a to be detected, as shown in FIG. 4A, the positions of the fringes on corresponding regions 23A and 23B of the light-receiving surface of the two-dimensional CCD 17 are shifted in the opposing directions. Therefore, when the local horizontal shift amount of the fringe 22 on the light-receiving surface is measured, the position information of the corresponding region on the surface 1a to be detected in the direction of the optical axis AX1 can be obtained. This means that the position information of each of all the small regions in the target detection region on the surface 1a to be detected can be independently measured on the basis of a single image on the light-receiving surface of the two-dimensional CCD 17. A region from which position information is to be obtained in practice can be arbitrarily selected from these small regions according to, e.g., an instruction input by an operator. The size of the small region, from which the position information is to be obtained, of the target detection region can be arbitrarily set (i.e., arbitrarily increased/decreased). When the size of the small region is increased, an averaging effect is enhanced.

The horizontal shift amount of the fringe (the image of the grating of the grating formation surface 8a) on the light-receiving surface can be calculated as follows. That is, the fringe is Fourier-transformed using the reciprocal number of the pitch of the fringe as a fundamental spatial frequency to obtain its phase component, and the phase component is converted into a horizontal shift amount. With this Fourier transformation method, the influence of the pattern on the surface 1a to be detected itself can be suppressed.

Figure 5A:
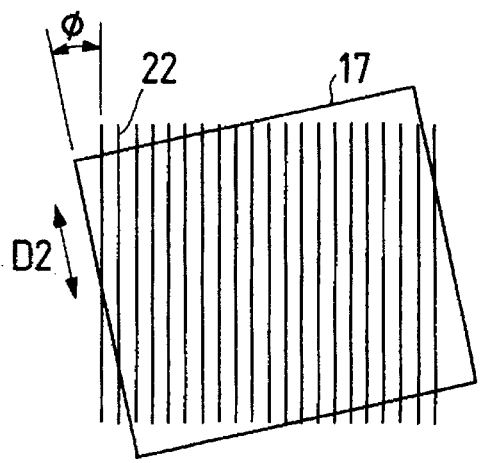
FIG. 5A is a chart showing a case wherein the scanning direction of the two-dimensional CCD is inclined with respect to fringes.
Figure 5B:
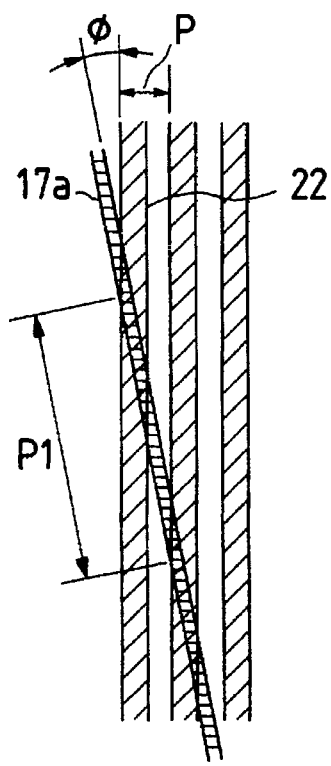
FIG. 5B is an enlarged view of main part of FIG. 5A.

In the example shown in FIG. 4B, a scanning direction D1 of the two-dimensional CCD 17 coincides with the longitudinal direction of the fringes 22 as the projected pattern. In contrast to this, when the longitudinal direction of the fringes 22 is inclined at an angle φ with respect to a scanning direction D2 of the two-dimensional CCD 17, as shown in FIG. 5A, the pitch P and the horizontal shift amount of the fringes 22 observed on the two-dimensional CCD 17 are enlarged to 1/sin φ times. More specifically, as shown in FIG. 5B, if a pitch on a single scan line 17a of the two-dimensional CCD with respect to the pitch P of the fringes is represented by P1, the following relationship is established:

$$P1 = P / \sin \phi \qquad (10)$$

For example, when φ=11.5°, 1/sinφ=5, and the horizontal shift amount of the fringes can be enlarged to about 5 times, thus improving the detection precision.

In the case of FIG. 4B, the pitch of the light-receiving elements in the scanning direction D1 of the two-dimensional CCD 17 is preferably set to be ½ or less the fundamental pitch P of the fringes 22 according to the Nyquist's theorem. In contrast to this, the pitch of the light-receiving elements of the two-dimensional CCD 17 in a direction perpendicular to the scanning direction D1 need only be smaller than the width of the area of the minimum position detection unit on the surface 1a to be detected.

In place of the two-dimensional CCD 17, a plurality of parallel linear position detection sensors may be arranged along the image formation plane of the fringes 22. Furthermore, in place of the two-dimensional CCD 17, an image detection sensor such as an image pickup tube, a microchannel plate (MCP), an image dissector tube (IDT), or the like may be used.

As described above, according to this embodiment, position information, in the direction of the optical axis AX1, of an arbitrary detection point on the surface 1a to be detected can be detected based on a single image by a simple optical system. When detection points are set on a large number of regions, the inclination information of the surface 1a to be detected can be obtained. Based on the information, the compensation amount calculation means 19 (FIG. 1) calculates the inclination of the surface 1a to be detected, and the compensation amount of the position, and drives the holding mechanism 3 through the drive means 4 according to the calculation results. Thus, the surface 1a to be detected (i.e., exposure surface) of the wafer 1 placed on the holder 2 can be set to precisely coincide with the image formation plane of the projection lens 5.

In this embodiment, a pattern to be projected onto the surface 1a to be detected is a pattern of phase gratings on the reflection type phase grating 8. In place of this pattern, an amplitude type grating pattern may or a mesh pattern may be projected. Furthermore, such patterns may be reflection or transmission type grating patterns.

Figure 6:
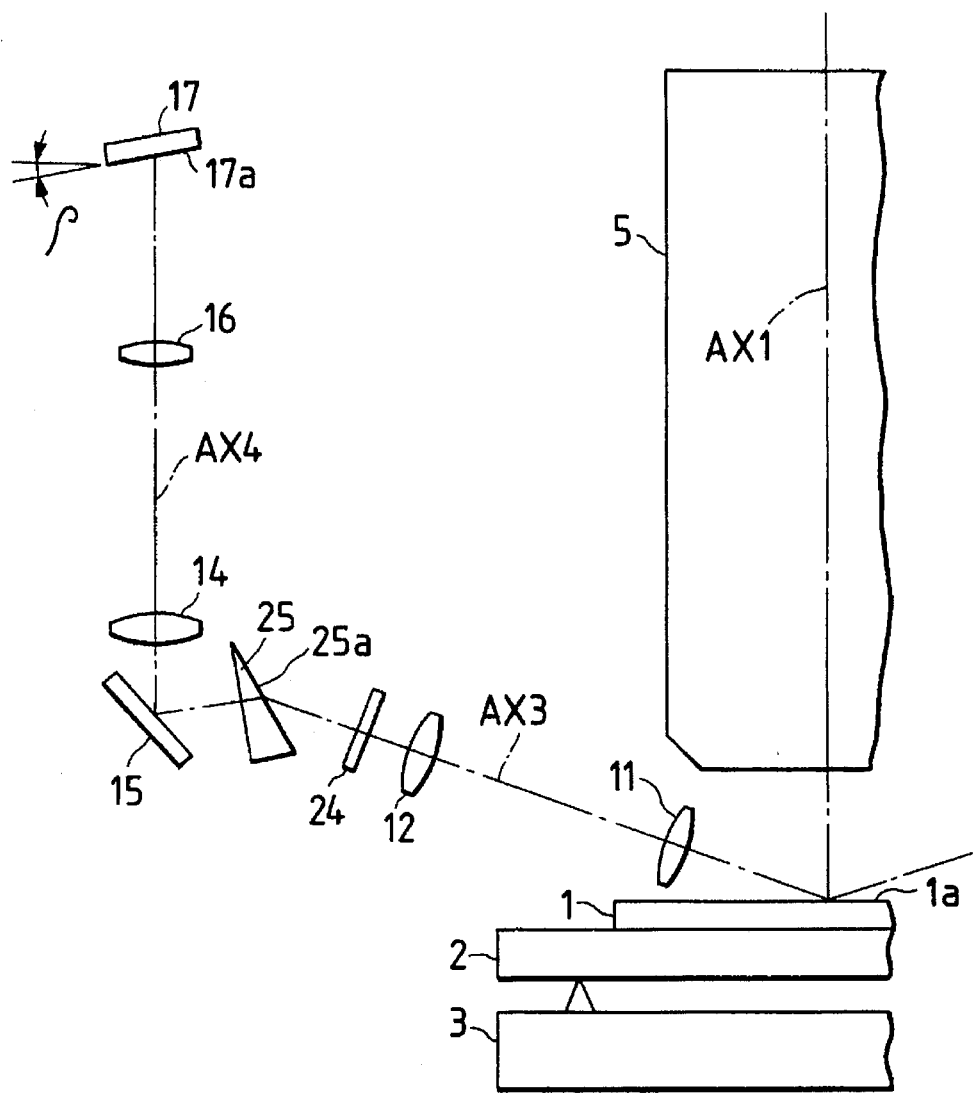
FIG. 6 is a diagram showing the left half of an optical system of a surface position detection apparatus according to another aspect of the present invention.

Another embodiment of the present invention will be described below with reference to FIGS. 6 and 7. In this embodiment, a prism is used in place of the swing & tilting correction diffraction grating 13 shown in FIG. 1. In FIG. 6, the same reference numerals denote the corresponding parts in FIG. 1, and a detailed description thereof will be omitted.

FIG. 6 shows the left-half portion of an optical system of this embodiment. In FIG. 6, a halfwave plate 24 and a prism 25 are arranged in turn along the extending line of the optical axis of a condenser lens 12. The halfwave plate 24 need not always be arranged. In a state wherein a surface 1a to be detected of a wafer 1 coincides with the image formation plane of a projection lens 5, an image of a pattern on the surface 1a to be detected is formed on a surface 25a of the prism 25 by a condensing optical system constituted by a lens 11 and the lens 12. That is, the surface 1a to be detected and the surface 25a of the prism 25 satisfy the Scheimpflug condition in association with the condensing optical system.

A light beam incident on the surface 25a of the prism 25 is refracted by the prism 25, and is guided toward a plane mirror 15. The light beam reflected by the plane mirror 15 is focused on a light-receiving surface 17a of a two-dimensional CCD 17 by a relay optical system constituted by a condenser lens 14 and an objective lens 16. Thus, the image on the surface 25a is re-formed on the light-receiving surface 17a. Other arrangements are the same as those in FIG. 1.

Figure 7:
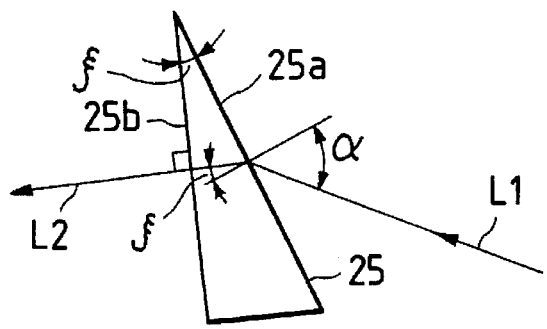
FIG. 7 is an enlarged view showing a swing & tilting correction prism shown in FIG. 6.

In this case, if a beam parallel to an optical axis AX3 of the condensing optical system constituted by the lenses 11 and 12 is represented by L1, as shown in FIG. 7, the incident angle of the beam L1 with respect to the prism 25 is α from FIG. 1. In FIG. 7, if the refractive index of the prism 25 for the wavelength of light transmitted through the prism 25 is represented by n, and the refraction angle is represented by ξ, the following equation is established:

$$\xi = \sin^{-1}(\sin \alpha / n) \quad (11)$$

In this embodiment, the vertical angle of the prism 25 is set to be ξ as in the refraction angle. Thus, a beam L2 emerges from a rear surface 25b of the prism 25 in a direction perpendicular to the rear surface 25b.

Therefore, in consideration of floating of an image caused by the glass of the prism 25, a swing or tilt angle (to be referred to as a swing angle hereinafter) ρ as an inclination of the relayed image formation plane of the surface 1a to be detected with respect to a plane perpendicular to the emerging beam L2 is given by:

$$\rho = \tan^{-1}(\tan \xi / n) \quad (12)$$

Assuming that the magnification of the relay optical system (the lenses 14 and 16) is 1, the swing angle ρ becomes an angle formed between the light-receiving surface 17a of the two-dimensional CCD 17 and a plane perpendicular to an optical axis AX4 of the relay optical system, i.e., the incident angle of a principal ray to the light-receiving surface 17a.

For example, when the refractive index n=1.8, and the incident angle α=80.1°, the swing angle ρ=20.0°, and approaches zero. The incident angle to the light-receiving surface 17a of the two-dimensional CCD 17 is also 20°. With this angle, it can be considered that a decrease in light-receiving amount is almost zero. In order to perfectly eliminate this influence, the incident-side surface (the image formation plane of the surface 1a to be detected) of the prism and the light-receiving surface 17a of the CCD preferably satisfy the Scheimpflug condition in association with the relay optical system (the lenses 14 and 16).

When the prism 25 is used in this manner, diversion of refracted light components can be smaller than that in a case wherein the swing & tilting correction diffraction grating 13 is used, and a light source of a wide wavelength range can be used. If diversion is large, the numerical aperture of the relay optical system constituted by the lenses 14 and 16 must be increased. If the incident angle α is large, the transmittances of P-polarized light and S-polarized light of light components refracted by the prism 25 become considerably different from each other. For example, when the incident angle α=80° and the refractive index n=1.8, the transmittance of the P-polarized light is 0.79, and that of the S-polarized light is 0.37. Therefore, when light components incident on the prism 25 are polarized, the transmittance of each polarized light component in the prism 25 varies depending on its polarization state, and the weight of information for each polarized light component varies. As a result, the position of the surface 1a to be detected cannot often be normally detected.

In this case, the halfwave plate 24 is arranged, as shown in FIG. 6, and a light beam whose direction of polarization is rotated through 45° by the halfwave plate 24 is incident on the prism 25. As a result, the P- and S-polarized light components are mixed, and the position detection can be normally performed. In place of the halfwave plate, a quarterwave plate may be used. When the quarterwave plate is used, circularly polarized light is incident on the prism 25, and the position detection can also be normally performed in a similar manner.

When the vertical angle of the prism 25 is set to be equal to the refraction angle ξ of the beam L1, as shown in FIG. 7, the refracted beam L2 is incident on the rear surface 25b of the prism 25 in a direction perpendicular to the rear surface 25b. Thus, when an image formed on the surface 25a is relayed, generation of an aberration such as an astigmatism can be suppressed.

As described above, in this embodiment, position information, in the direction of the optical axis AX1, of an arbitrary detection point on the surface 1a to be detected can be detected based on a single image by a simple optical system. When detection points are set on a large number of regions, the inclination information of the surface 1a to be detected can be obtained.

An embodiment according to another aspect of a surface position detection apparatus of the present invention will be described below with reference to FIGS. 8 to 14.

Figure 8:
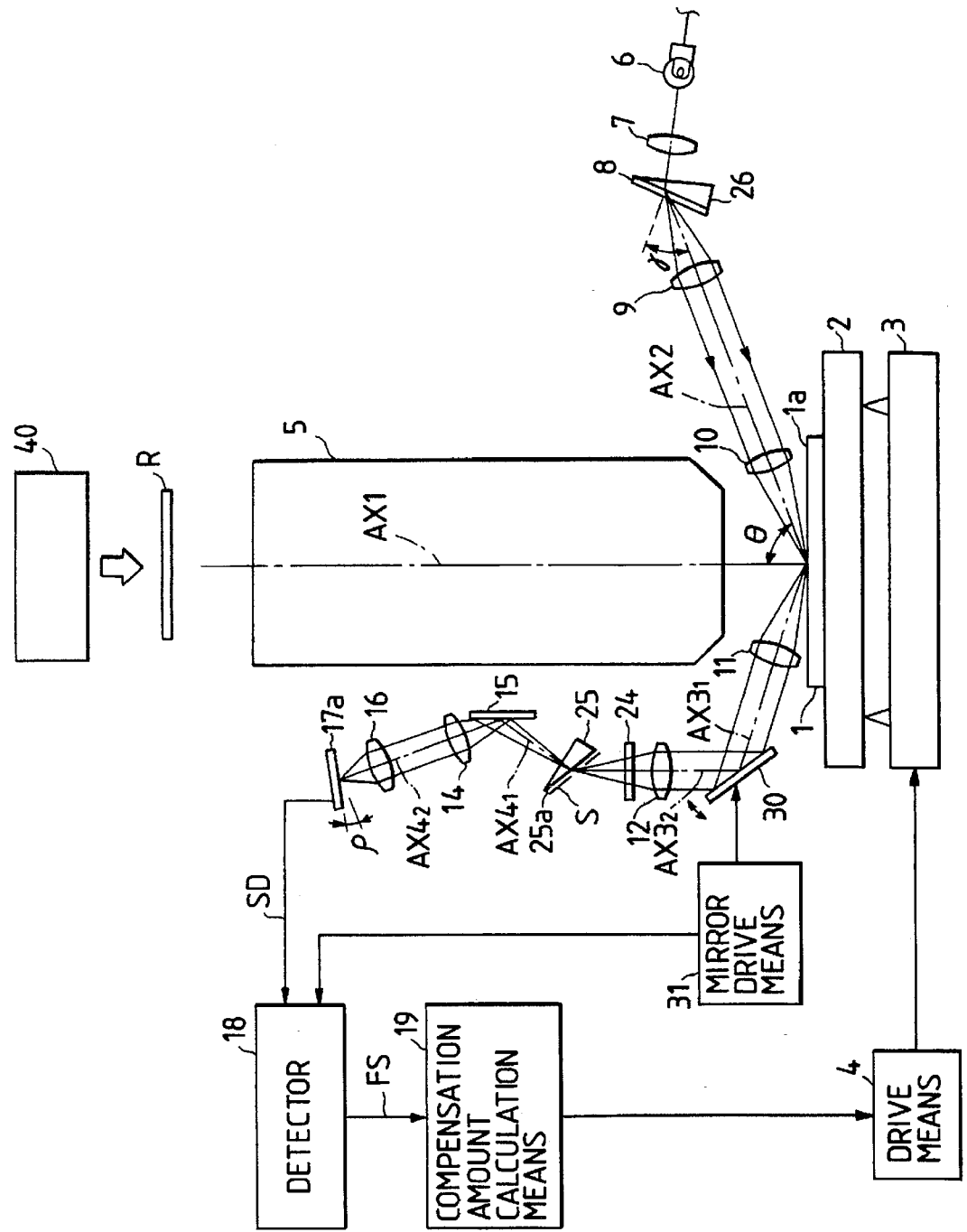
FIG. 8 is a diagram showing main part of a surface position detection apparatus according to still another aspect of the present invention.

FIG. 8 is a diagram showing main part of a surface position detection apparatus. In place of detecting the position of a surface 1a to be detected by detecting an image in the surface position detection apparatus of the present invention shown in FIG. 6, this surface position detection apparatus is arranged to detect the position of the surface 1a to be detected by scanning a detector relative to an image on the detector.

For the sake of simplicity, the same reference numerals in FIG. 8 denote parts having the same functions as in FIG. 1.

In FIG. 8, main illumination light from a main illumination light source 40 illuminates a reticle R having a predetermined circuit pattern on its surface. The image on the reticle R is projected onto a surface 1a to be exposed (detected) by a projection lens 5.

An optical system and a processing system upon detection of the position of the current exposure region on the surface 1a to be detected will be described below.

In FIG. 8, illumination light emitted from a light source 6 for supplying white light having a wide wavelength width is converted into a substantially collimated light beam by a condenser lens 7, and the substantially collimated light beam becomes incident on a deflection prism 26. The deflection prism 26 deflects the substantially collimated light beam from the condenser lens 7 by refracting it. A transmission type grating pattern plate 8 constituted by a stripe pattern extending in a direction perpendicular to the plane of FIG. 8 is arranged on the exit-side surface of the deflection prism 26. The transmission type grating pattern plate 8 is arranged, so that a grating pattern formation surface 8a on which transmission and light-shielding portions are alternately formed faces a wafer 1. Note that it is not preferable to supply illumination light to the transmission type grating pattern plate 8 without going through the deflection prism 26 since illumination nonuniformity occurs on the transmission type grating pattern plate 8.

The illumination light reaching the grating pattern formation surface 8a is transmitted through the grating pattern formation surface 8a, and is then incident on a projection optical system (lenses 9 and 10) arranged along an optical axis AX2 crossing an optical axis AX1 of the projection lens 5 at an angle θ. The projection optical system is constituted by a condenser lens 9 and a projection objective lens 10, and sets a conjugate arrangement between the grating pattern formation surface 8a and the surface 1a to be detected. Since the grating pattern formation surface 8a and the surface 1a to be detected are arranged to satisfy the Scheimpflug condition in association with the projection optical system (the lenses 9 and 10), the grating pattern on the grating pattern formation surface 8a is precisely formed on the entire surface 1a to be detected.

Figure 9:
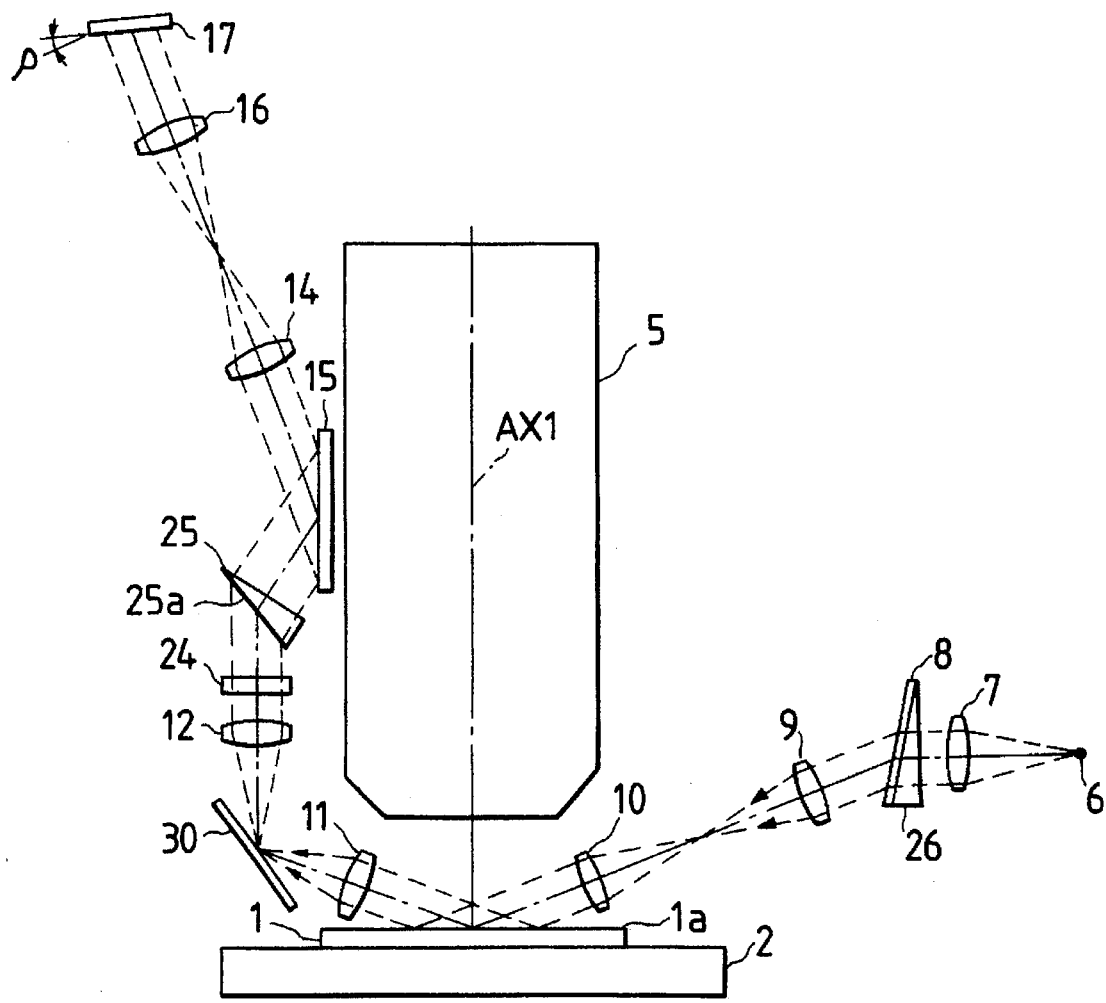
FIG. 9 is an optical path diagram showing the fact that an optical system of the surface position detection apparatus shown in FIG. 8 is a both side telecentric system.

As is apparent from an optical path indicated by dotted lines in FIG. 9, the projection optical system constituted by the condenser lens 9 and the projection objective lens 10 is a so-called both side telecentric optical system, and conjugate points on the grating pattern formation surface 8a and the surface 1a to be detected have an equal magnification over the entire surfaces. Therefore, since the grating pattern formation surface 8a has the grating pattern at equal intervals having a direction perpendicular to the plane of FIG. 8 as a longitudinal direction, an image formed on the surface 1a to be detected becomes a grating pattern at equal intervals having the direction perpendicular to the plane of FIG. 8 as the longitudinal direction.

Referring back to FIG. 8, light projected onto the surface 1a to be detected is reflected by the surface 1a to be detected, and is incident on a condensing optical system (lenses 11 and 12). The condensing optical system is constituted by a light-receiving objective lens 11 and a condenser lens 12, and an incident-side optical axis $AX3_1$ of the focusing optical system is axially symmetrical with the optical axis AX2 of the projection optical system (the lenses 9 and 10) about the optical axis AX1 of the projection lens 5. A vibration mirror 30 as a scanning means is arranged in an optical path between the surface 1a to be detected and a second surface (incident surface) 25a, so that light incident on the light-receiving objective lens 11 reaches the focusing lens 12 through the vibration mirror 30. In this embodiment, the vibration mirror 30 is arranged on a substantially pupil plane of the condensing optical system (the lenses 11 and 12). However, the vibration mirror 30 need only be arranged in an optical path between the surface 1a to be detected and a light-receiving surface 17a.

Figure 10:
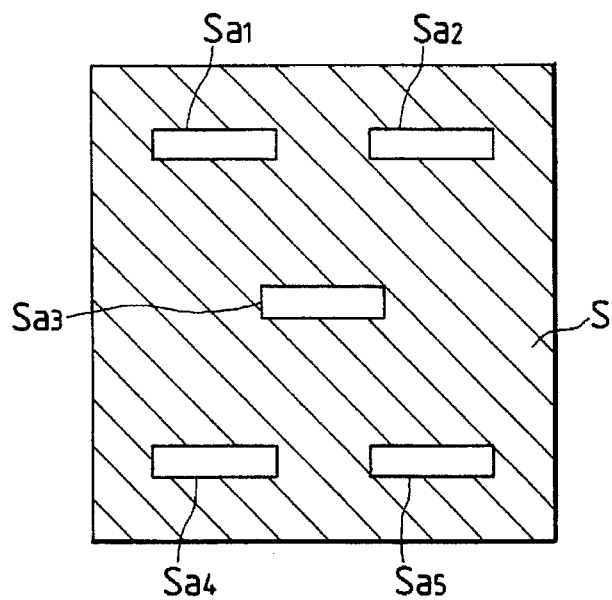
FIG. 10 is a plan view of a light-receiving slit.

When the surface 1a to be detected coincides with the image formation plane of the projection lens 5, the incident surface 25a of a swing & tilting correction prism 25 is located on a plane conjugate with the surface 1a to be detected by the condensing optical system (the lenses 11 and 12). At this time, light reflected by the surface 1a to be detected is focused on the incident surface 25a of the swing & tilting correction prism 25. The incident surface 25a has a light-receiving slit S as a light-shielding means. The light-receiving slit S has, e.g., five opening portions $Sa_1$, $Sa_2$, $Sa_3$, $Sa_4$, and $Sa_5$ (to be referred to simply as $Sa_1$ to $Sa_5$ hereinafter), as shown in FIG. 10. The light reflected by the surface 1a to be detected and transmitted through the condensing optical system (the lenses 11 and 12) passes through the opening portions $Sa_1$ to $Sa_5$ of the light-receiving slit S, and is incident on the swing & tilting correction prism 25.

Figure 11:
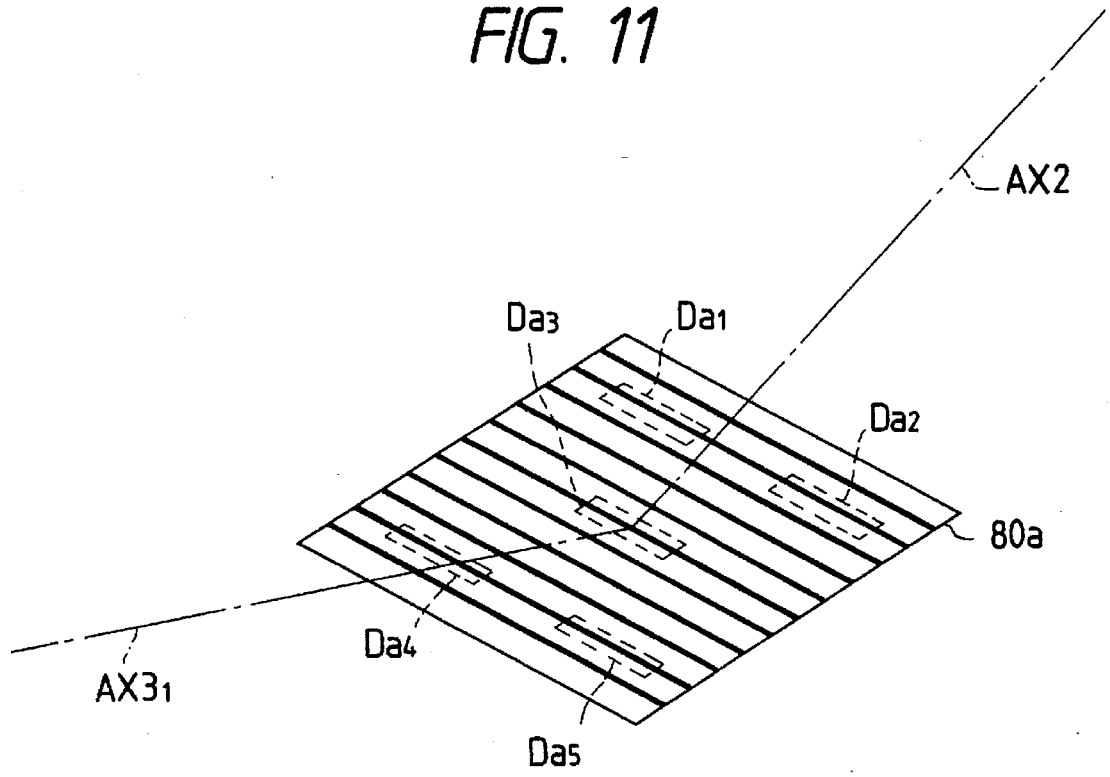
FIG. 11 is a view showing the relationship between a grating pattern projected onto a surface to be detected and a detection region.
Figure 12:
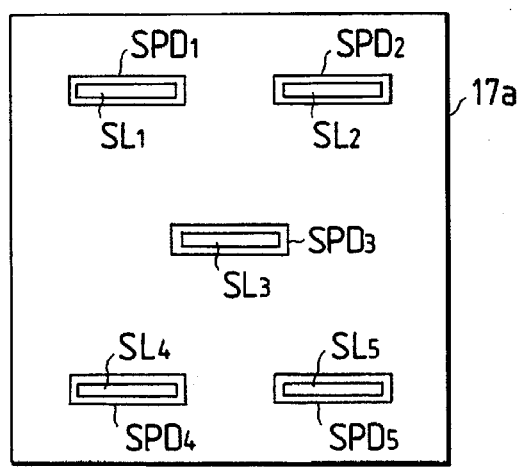
FIG. 12 is a view showing the relationship between the arrangement of silicon photodiodes and slit images on a light-receiving surface.

The number of opening portions Sa of the light-receiving slit S corresponds to the number of detection points on the surface 1a to be detected. For example, FIG. 11 shows a state wherein an image 80a on the grating pattern formation surface 8a is projected onto the surface 1a to be detected. As shown in FIG. 11, detection points (detection regions) $Da_1$, $Da_2$, $Da_3$, $Da_4$, and $Da_5$ (to be referred to simply as $Da_1$ to $Da_5$ hereinafter) correspond to the five opening portions $Sa_1$ to $Sa_5$ of the light-receiving slit S shown in FIG. 10. When the number of detection points on the surface 1a to be detected is to be increased, the number of opening portions Sa need only be increased. Therefore, even when the number of detection points is increased, the arrangement of the apparatus can be prevented from being complicated.

Furthermore, the image formation plane of the projection lens 5 and the incident surface 25a of the swing & tilting correction prism 25 are arranged to satisfy the Scheimpflug condition in association with the condensing optical system (the lenses 11 and 12). Therefore, in a state wherein the surface 1a to be detected and the image formation plane coincide with each other, the image 80a of the grating pattern on the surface 1a to be detected can be precisely re-formed on the entire incident surface 25a. As is apparent from an optical path indicated by dotted lines in FIG. 9, since the condensing optical system (the lenses 11 and 12) constitutes a both side telecentric optical system, each point on the surface 1a to be detected and a conjugate point on the incident surface 25a of the prism have an equal magnification on the entire surfaces. Therefore, in a state wherein the surface 1a to be detected coincides with the image formation plane of the projection lens 5, an image projected onto the light-receiving slit S also includes gratings at equal intervals having the direction perpendicular to the plane of FIG. 8 as the longitudinal direction. More specifically, in this embodiment, when the surface 1a to be detected coincides with the image formation plane of the projection lens 5, the grating pattern formation surface 8a, the surface 1a to be detected, and the incident surface 25a of the swing & tilting correction prism 25 have a relationship satisfying the Scheimpflug condition therebetween, and have an equal magnification over their entire surfaces.

A horizontal shift amount y of the image of the grating pattern on the incident surface 25a of the swing & tilting correction prism 25 when the displacement of the surface 1a to be detected in the direction of the optical axis AX1 is z is calculated. If the incident angle of the principal ray of light incident on the surface 1a to be detected is represented by θ, the lateral magnification of the focusing optical system (the lenses 11 and 12) is represented by β, and a magnification along a swung or titled image formation plane from the surface 1a to be detected to the incident surface 25a of the swing & tilting correction prism 25 is represented by β', the horizontal shift amount y is given as follows from the above-mentioned equations (1) and (2):

$$y=2\cdot\beta'\cdot\tan\theta\cdot z=2(\beta^2\sin^2\theta+\beta^4\sin^4\theta/\cos^2\theta)^{1/2}\cdot z \quad (13)$$

More specifically, when the incident angle θ of the grating pattern to be projected onto the surface 1a to be detected is increased, the horizontal shift amount y is increased, and the surface position can be detected with higher precision.

The projection optical system (the lenses 9 and 10) and the condensing optical system (the lenses 11 and 12) respectively satisfy the Scheimpflug condition. Therefore, in this embodiment, the projection optical system (the lenses 9 and 10) and the condensing optical system (the lenses 11 and 12) satisfy the relationships given by equations (5) and (6) like in the embodiment shown in FIG. 1.

When the light-receiving surface 17a is arranged on the second surface, if the incident angle θ with respect to the surface 1a to be detected is large, the incident angle of a light beam onto the light-receiving surface also becomes large. For example, when a silicon photodiode SPD is arranged on the light-receiving surface 17a, if the incident angle of a light beam onto the silicon photodiode SPD is large, surface reflection on the silicon photodiode SPD is increased, and the light beam is eclipsed. As a result, the light-receiving amount may be considerably decreased.

In this embodiment, in order to prevent such a decrease in light-receiving amount, as shown in FIG. 8, the swing & tilting correction prism 25 shown in FIG. 7 is arranged as a deviation means on the second surface to deviate a light beam emerging from the condensing optical system (the lenses 11 and 12).

A relay optical system constituted by a relay lens 14, a plane mirror 15, and a relay lens 16 is arranged on the exit side of the swing & tilting correction prism 25. The relay optical system is a both side telecentric optical system, as shown in FIG. 9.

Referring back to FIG. 8, a light beam incident on the swing & tilting correction prism 25 is refracted by the swing & tilting correction prism 25, and is then guided toward the plane mirror 15. The light beam reflected by the plane mirror 15 is focused on the light-receiving surface 17a by the relay optical system (the lenses 14 and 16, and the mirror 15).

More specifically, the relay optical system (the lenses 14 and 16, and the mirror 15) forms another conjugate image of the image formed on the incident surface 25a of the swing & tilting correction prism 25 on the light-receiving surface 17a.

In this manner, in this embodiment, since the swing & tilting correction prism 25 is used as the deviation means, the incident angle of the light beam incident on the light-receiving surface 17a is decreased, and a decrease in light-receiving amount of the silicon photodiode SPD arranged on the light-receiving surface 17a can be prevented.

When the incident angle α of a light beam incident on the surface 1a to be detected is large, a halfwave plate 24 is preferably arranged as in the embodiment shown in FIG. 6. In this embodiment, the halfwave plate 24 is arranged in an optical path between the condensing optical system (the lenses 11 and 12) and the swing & tilting correction prism 25. Therefore, like in the embodiment shown in FIG. 6, a light beam incident on the swing & tilting correction prism 25 includes mixed P- and S-polarized light components, and the position detection on the surface 1a to be detected can be normally performed.

Since the light-receiving slit S having the five opening portions $Sa_1$ to $Sa_5$ is arranged on the incident surface 25a of the swing & tilting correction prism 25, as shown in FIG. 10, the image of the grating pattern re-formed on the incident surface 25a is locally shielded. More specifically, only light components from the image of the grating pattern formed on the regions of the opening portions $Sa_1$ to $Sa_5$ of the light-receiving slit S emerge from the swing & tilting correction prism 25.

The images of the opening portions $Sa_1$ to $Sa_5$ of the light-receiving slit S formed on the incident surface 25a are relayed to a light-receiving unit 17 by the relay optical system (the lenses 14 and 16, and the mirror 15). As shown in the plan view of FIG. 12, the light-receiving unit 17 is constituted by arranging five silicon photodiodes $SPD_1$, $SPD_2$, $SPD_3$, $SPD_4$, and $SPD_5$ (to be referred to simply as $SPD_1$ to $SPD_5$ hereinafter) corresponding to the opening portions $Sa_1$ to $Sa_5$ of the light-receiving slit S on the light-receiving surface 17a. The images of the opening portions $Sa_1$ to $Sa_5$ are formed on these silicon photodiodes $SPD_1$ to $SPD_5$ as slit images $SL_1$, $SL_2$, $SL_3$, $SL_4$, and $SL_5$ (to be referred to simply as $SL_1$ to $SL_5$ hereinafter). The slit images $SL_1$ to $SL_5$ are formed to be smaller than the silicon photodiodes $SPD_1$ to $SPD_5$.

In this embodiment, the plurality of silicon photodiodes are arranged on the light-receiving surface. Instead, a CCD (two-dimensional charge-coupled type image pickup device) or a photomultiplier may be used.

When the surface 1a to be detected is moved vertically along the optical axis of the projection lens 5, the pattern projected onto the incident surface 25a of the swing & tilting correction prism 25 is horizontally shifted in the pitch direction of the pattern in correspondence with the vertical movement of the surface 1a to be detected. When the horizontal shift amount is detected using the vibration mirror 30 and the light-receiving unit 17 by the method disclosed in U.S. Pat. No. 4,687,322, the surface position on the surface 1a to be detected in the direction of the optical axis AX1 can be detected.

Referring back to FIG. 8, the surface position detection based on the principle of a photoelectric microscope will be described in detail below. In FIG. 8, the vibration mirror 30 is arranged in the optical path of the condensing optical system (the lenses 11 and 12). A mirror drive means 31 causes the vibration mirror 30 to vibrate in a direction of an arrow in FIG. 8 at a predetermined period T on the basis of a signal from an internal oscillator. Upon vibration of the vibration mirror 30, the image of the grating pattern formed on the incident surface 25a of the swing & tilting correction prism 25 also vibrates. At this time, the amplitude of the vibration of the grating pattern formed on the incident surface 25a is set to be ½ or less the pitch of the grating pattern, and the width of each of the opening portions $Sa_1$ to $Sa_5$ of the slit S is also set to be ½ or less the pitch of the grating pattern. Upon vibration of the image of the grating pattern, the light amount of light passing through the incident surface 25a, i.e., the regions of the opening portions $Sa_1$ to $Sa_5$ of the light-receiving slit S changes. The light passing through the opening portions reaches the regions of the silicon photodiodes $SPD_1$ to $SPD_5$ on the light-receiving surface 17a by the relay optical system (the lenses 14 and 16, and the mirror 15).

For the sake of simplicity, only one silicon photodiode $SPD_1$ will be described below. Light passing through the region of the opening portion $Sa_1$ of the light-receiving slit S reaches the region of the slit image $SL_1$ on the silicon photodiode $SPD_1$. The brightness of the slit image $SL_1$ changes upon vibration of the vibration mirror 30.

Figure 13:
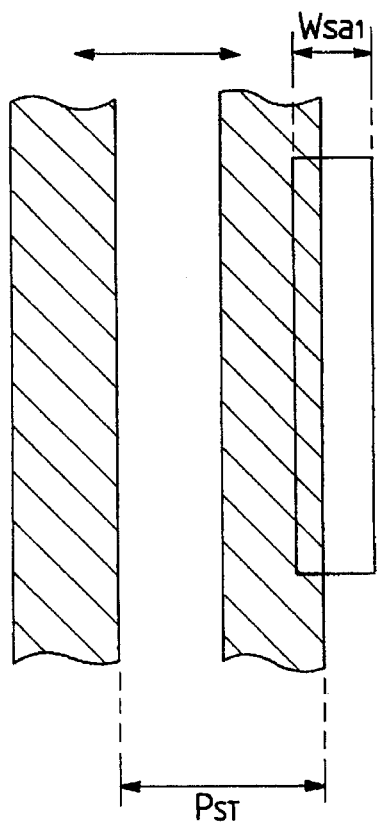
FIG. 13 is an enlarged view of openings on the light-receiving slit.

A change in brightness of the slit image $SL_1$ will be described in detail below with reference to FIG. 13. FIG. 13 is an enlarged view of a portion near the opening portion $Sa_1$ of the light-receiving slit S. In FIG. 13, a grating pattern ST is formed on the light-receiving slit S at a pitch $P_{ST}$, and vibrates in a direction of an arrow in FIG. 13 upon vibration of the vibration mirror 30.

A width $WSa_1$ of the opening portion $Sa_1$ preferably satisfies:

$$WSa_1 \leq P_{ST}/2 \tag{14}$$

where $P_{ST}$ is the pitch of the grating pattern ST formed on the opening portion $Sa_1$. An amplitude $A_{ST}$ of the grating pattern ST, which vibrates upon vibration of the vibration mirror 30, preferably satisfies:

$$A_{ST} \leq P_{ST}/2 \tag{15}$$

When the width $WSa_1$ of the opening portion $Sa_1$ does not satisfy relation (14) or when the amplitude $A_{ST}$ of the grating pattern does not satisfy relation (15), it is not preferable since a change in light amount at the opening portion $Sa_1$ upon vibration of the vibration mirror 30 is decreased, and the detection precision is impaired. In this embodiment, since the width $WSa_1$ of the opening portion is set to be ½ or less the pitch $P_{ST}$ of the grating pattern ST, and the amplitude $A_{ST}$ of the grating pattern ST is set to be ½ or less the pitch $P_{ST}$, the change in light amount upon vibration of the vibration mirror 30 can be prevented from being decreased.

The opening portion $Sa_1$ is located at a position where the center of the opening portion $Sa_1$ coincides with the center of vibration of the grating pattern ST when the surface 1a to be detected coincides with the image formation plane of the projection lens. Since the width of the opening portion $Sa_1$ is set to be ½ or less the pitch of the grating pattern, and the amplitude of the grating pattern is set to be ½ or less the pitch, when the grating pattern ST vibrates, the light-receiving amount on the silicon photodiode $SPD_1$ changes. The silicon photodiode $SPD_1$ outputs the change in light intensity, i.e., a detection output $SD_1$ according to optical modulation, to a detector 18.

Similarly, the remaining silicon photodiodes $SPD_2$, $SPD_3$, $SPD_4$, and $SPD_5$ output detection outputs $SD_2$, $SD_3$, $SD_4$, and $SD_5$ according to optical modulation of the slit images $SL_2$, $SL_3$, $SL_4$, and $SL_5$ to the detector 18. The mirror drive means 31 outputs an AC signal having the same phase as the vibration period T of the vibration mirror 30 to the detector 18.

The detector 18 performs synchronous rectification, i.e., synchronous detection of the detection outputs $SD_1$, $SD_2$, $SD_3$, $SD_4$, and $SD_5$ (to be referred to simply as $SD_1$ to $SD_5$ hereinafter) with reference to the phase of the AC signal having the period T, and outputs detection output signals $FS_1$, $FS_2$, $FS_3$, $FS_4$, and $FS_5$ (to be referred to simply as $FS_1$ to $FS_5$ hereinafter) to a compensation amount calculation means 19. The detection output signals $FS_1$ to $FS_5$ are so-called S-curve signals, and respectively go to zero level when the detection regions $Da_1$ to $Da_5$ on the surface 1a to be detected are located on the image formation plane of the projection lens 5, i.e., when the detection outputs $SD_1$ to $SD_5$ change at a period ½ the vibration period T of the vibration mirror 30. The detection output signals $FS_1$ to $FS_5$ are at a positive level when the detection regions $Da_1$ to $Da_5$ on the surface 1a to be detected are displaced above the image formation plane of the projection lens 5; they are at a negative level when the detection regions $Da_1$ to $Da_5$ on the surface 1a to be detected are displaced below the image formation plane of the projection lens 5. In this manner, the detection output signals $FS_1$ to $FS_5$ indicate output values corresponding to the displacement of the surface 1a to be detected.

Thereafter, the compensation amount calculation means 19, which received the detection output signals $FS_1$ to $FS_5$, calculates the positions, in the focusing direction, of the detection regions $Da_1$ to $Da_5$ on the surface 1a to be detected according to the positive/negative levels of the detection output signals $FS_1$ to $FS_5$, thus obtaining the average inclination of the surface 1a to be detected, and the position, in the focusing direction, of the surface 1a to be detected. The means 19 then calculates a compensation amount for locating the surface 1a to be detected within the range of the focal depth of the projection lens 5, and a compensation amount in the focusing direction. The compensation amount calculation means 19 sends these compensation amounts to a drive means 4.

The drive means 4 drives a holding mechanism 3 on the basis of the compensation amount of the inclination to perform leveling of a holder 2. The drive means 4 then drives the holder 2 on the basis of the compensation amount in the focusing direction to move the wafer 1 in the focusing direction.

With this arrangement, a plurality of detection points on the surface 1a to be detected are simultaneously detected, and the surface to be detected can be located at a predetermined position on the basis of the detection outputs.

Figure 14:
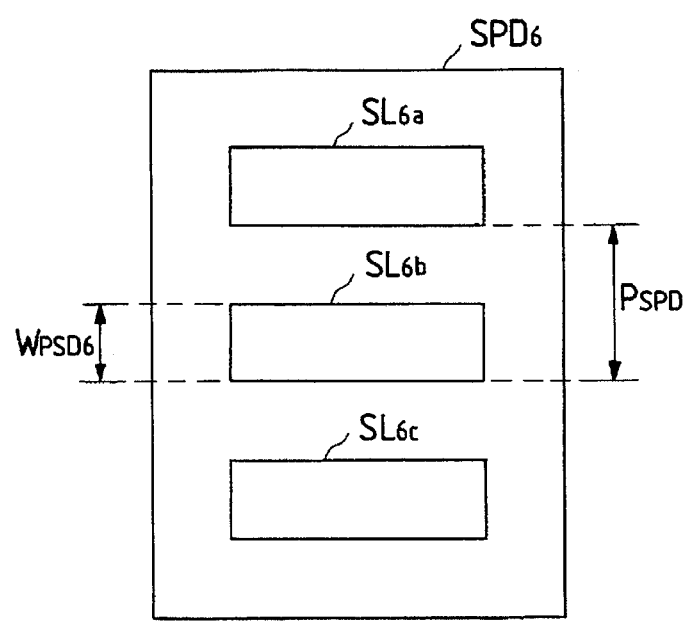
FIG. 14 is a view showing an example wherein a plurality of slit images are formed on one silicon photodiode.

Alternatively, as shown in FIG. 14, a plurality of slit images (for example, three slit images $SL_{6a}$, $SL_{6b}$, and $SL_{6c}$) may be formed on a single silicon photodiode $SPD_6$. At this time, a pitch $P_{SPD}$ of the slit images $SL_{6a}$, $SL_{6b}$, and $SL_{6c}$ preferably satisfies:

$$P_{SPD} = m \cdot P_{ST} \tag{16}$$

where m is an integer.

A width $W_{SPD6}$ of each of the slit images $SL_{6a}$, $SL_{6b}$, and $SL_{6c}$ preferably satisfies:

$$W_{SPD6} \leq P_{ST}/2 \tag{17}$$

When the pitch $P_{SPD}$ of the slit images $SL_{6a}$, $SL_{6b}$, and $SL_{6c}$ falls outside a range given by equation (16), it is not preferable since a change in light amount upon vibration of the vibration mirror 30 varies in units of slit images $SL_{6a}$, $SL_{6b}$, and $SL_{6c}$, and detection values become inaccurate. When the width $W_{SPD6}$ of each of the slit images $SL_{6a}$, $SL_{6b}$, and $SL_{6c}$ falls outside a range given by relation (17), it is not preferable since a change in light amount upon vibration of the vibration mirror 30 is decreased.

With the above-mentioned arrangement, the light-receiving amount on the silicon photodiode $SPD_6$ is increased, and the corresponding region on the surface $1a$ to be detected can be widened, thus obtaining an averaging effect.

In this embodiment, light passing through the light-receiving slit S is incident on the silicon photodiodes SPD arranged on the light-receiving surface $17a$. However, the light need not always be incident on the silicon photodiodes SPD through the light-receiving slit S. When light is incident on the silicon photodiodes SPD without going through the light-receiving slit S, the regions of the silicon photodiodes SPD serve as light-receiving regions on the surface $1a$ to be detected. More specifically, the silicon photodiodes SPD need only be arranged at positions corresponding to the detection regions on the surface $1a$ to be detected.

In this embodiment, the light-receiving slit S is arranged on the second surface (the incident surface $25a$ of the swing & tilting correction prism 25), but may be arranged on the light-receiving surface $17a$ of the light-receiving unit 17. At this time, the size of each opening portion Sa of the light-receiving slit S is preferably smaller than that of the light-receiving surface $17a$.

In this embodiment, a plurality of silicon photodiodes may be arranged on the light-receiving surface $17a$ by a photoetching method. This can advantageously cope with a great increase in the number of opening portions Sa of the light-receiving slit S.

The surface of the wafer as the surface $1a$ to be detected need not always be flat depending on processes. In this case, the number of detection regions (detection points) on the surface $1a$ to be detected can be increased. In order to increase the number of detection points on the surface $1a$ to be detected, the number of opening portion of the light-receiving slit S corresponding to the detection regions need only be increased. In this manner, since the surface position detection apparatus of the present invention can increase the number of detection points on the surface $1a$ to be detected with a simple arrangement, surface positions over a wide range on the surface $1a$ to be detected can be detected. Even when the number of detection points is increased, they can be simultaneously subjected to detection, and the throughput can be prevented from being decreased.

What is claimed is:

1. A surface position detection apparatus for detecting a surface position of a surface to be detected and for improving the accuracy of position detection in a direction perpendicular to the surface, comprising:

a projection pattern formed on a first surface;

a projection optical system which projects a light beam from said first surface in an oblique direction onto said surface to be detected and forms an image of the pattern thereon;

a condensing optical system which condenses a light beam reflected by said surface to be detected, and forms an image of the pattern on a second surface; and a detector system which receives a light beam emerging from said second surface and which photoelectrically detects the image of the pattern thereon, wherein said first surface and said surface to be detected are arranged to satisfy a Scheimpflug condition in association with a principal plane of said projection optical system, and said surface to be detected and said second surface are arranged to satisfy a Scheimpflug condition in association with a principal plane of said condensing optical system;

wherein said apparatus includes a deviation device, arranged on said second surface, which deviates the light beam emerging from said condensing optical system in a direction that reduces the angle of incidence of the emerging light beam on a light-receiving surface of the detector system, said deviation device including a wedge-shaped prism, said wedge-shaped prism being arranged so that an incident surface of said wedge-shaped prism is located on said second surface, and a relay optical system arranged between said second surface and said light-receiving surface of said detector system, which sets a conjugate relationship between said second surface and said light-receiving surface.

2. An apparatus according to claim 1, wherein the incident surface of said wedge-shaped prism and said light-receiving surface are arranged to satisfy the Scheimpflug condition in association with said relay optical system.

3. An apparatus according to claim 1, wherein said wedge-shaped prism is arranged, so that a principal ray of a light beam emerging from said wedge-shaped prism is substantially parallel to a normal to an exit surface of said wedge-shaped prism.

4. An apparatus according to claim 1, wherein said wedge-shaped prism is arranged to satisfy the following condition:

$$\rho = \tan^{-1}(\tan \xi/n)$$

where $\xi$ is the refraction angle of said wedge-shaped prism, n is the refractive index of said wedge-shaped prism, and $\rho$ is the angle formed between a principal ray of a light beam emerging from said relay optical system and a normal to said light-receiving surface.

5. An apparatus according to claim 1, wherein each of said projection optical system, said condensing optical system, and said relay optical system is constituted as a both side telecentric optical system.

6. An apparatus according to claim 1, wherein said detector system includes an image pick-up device having said light-receiving surface and which detects an image formed on said light-receiving surface.

7. An apparatus according to claim 1, wherein said apparatus includes:

a calculator which calculates a position of said surface to be detected based on an output signal from said detector system; and a drive device which moves said surface to be detected to a predetermined position based on an output signal from said calculator.

8. An apparatus according to claim 1, wherein said apparatus includes a scanner which scans the image of the projection pattern relative to said light-receiving surface of said detector system.

9. An apparatus according to claim 8, wherein said apparatus includes a calculator, said scanner includes:

a vibration mirror, arranged in an optical path between said surface to be detected and said light-receiving surface, to scan a beam; and a mirror drive device which outputs a signal to said detector system and outputs a drive signal to said vibration mirror, and said calculator calculates a position of said surface to be detected based on an output signal from said detector system.

10. An apparatus according to claim 9, wherein said apparatus includes a slit arranged on said second surface and having a plurality of opening portions allowing light from said condensing optical system to pass therethrough, and said detector has a plurality of detection regions corresponding in number to said opening portions.

11. An apparatus according to claim 9, wherein said wedge-shaped prism is arranged, so that light emerges from said wedge-shaped prism in a direction substantially perpendicular to an exit-side surface of said wedge-shaped prism.

12. An apparatus according to claim 10, wherein said projection pattern is constituted by forming bright and dark fringes on said surface to be detected at a predetermined pitch, and said vibration mirror vibrates to scan the fringes in a pitch direction of the fringes.

13. An apparatus according to claim 12, wherein each of said opening portions is arranged to satisfy the following condition:

$$W \leq P/2$$

where P is the pitch of the images of the fringes on said slit, and W is the width, in the pitch direction of said opening portion of said slit.

14. An apparatus according to claim 12, wherein said vibration mirror is driven to satisfy the following condition:

$$A \leq P/2$$

where P is the pitch of the images of the fringes on said slit, and A is the amplitude of the images of the fringes, which vibrate on said slit.

15. A surface position detection apparatus for detecting a surface position of a surface to be detected, comprising the following parts arranged along an optical path in the order recited:

a projection pattern;
a projection optical system;
a condensing optical system;
a wedge-shaped prism;
a relay optical system; and
a detector system;
wherein said projection optical system has a first optical axis extending to said surface to be detected in an oblique direction with respect to said surface to be detected;
said condensing optical system has a second optical axis extending from said surface to be detected in an oblique direction with respect to said surface to be detected;
said projection pattern and said surface to be detected satisfy a Scheimpflug condition in association with a principle plane of said projection optical system;
said surface to be detected and an incident surface of said wedge-shaped prism satisfy a Scheimpflug condition in association with a principal plane of said condensing optical system;
the incident surface of said wedge-shaped prism and a light-receiving surface of said detector system are conjugate with respect to said relay optical system; and
light from said projection pattern reaches said light-receiving surface of said detector system via said projection optical system, said surface to be detected, said condensing optical system, said wedge-shaped prism and said relay optical system.

16. An apparatus according to claim 15, wherein said wedge-shaped prism is arranged, so that a principal ray of a light beam emerging from said wedge-shaped prism is substantially parallel to a normal to an exit surface of said wedge-shaped prism.

17. An apparatus according to claim 15, wherein said wedge-shaped prism is arranged to satisfy the following condition:

$$\rho = \tan^{-1}(\tan \xi / n)$$

where $\xi$ is the refraction angle of said wedge-shaped prism, n is the refractive index of said wedge-shaped prism, and $\rho$ is the angle formed between a principal ray of a light beam emerging from said relay optical system and a normal to said light-receiving surface.

18. An apparatus according to claim 15, wherein each of said projection optical system, said condensing optical system, and said relay optical system is constituted as a both side telecentric optical system.

19. An apparatus according to claim 15, wherein said wedge-shaped prism is arranged, so that light emerges from said wedge-shaped prism in a direction substantially perpendicular to an exit-side surface of said wedge-shaped prism.

20. An apparatus according to claim 15, wherein said apparatus includes:

a calculator which calculates a position of said surface to be detected based on an output signal from said detector system; and a driving device which moves said surface to be detected to a predetermined position based on an output signal from said calculator.

21. An exposure apparatus which projects an image of a reticle onto a wafer, comprising the following elements which are arranged along an optical path in the following order:

a projection pattern;
a projection optical system;
a condensing optical system;
a wedge-shaped prism;
a relay optical system; and
a detector system;
wherein,
said projection optical system has a first optical axis which is inclined with respect to said wafer;
said condensing optical system has a second optical axis which is inclined with respect to said wafer;
said projection pattern and said wafer are arranged to satisfy a Scheimpflug condition in association with a principal plane of said projection optical system;
said wafer and an incident surface of said wedge-shaped prism are arranged to satisfy a Scheimpflug condition in association with a principal plane of said condensing optical system;
said incident surface of the wedge-shaped prism and a light receiving surface of said detector system are conjugate with respect to said relay optical system; and
light from said projection pattern reaches said light-receiving surface of the detector system via said projection optical system, said wafer, said condensing optical system, said wedge-shaped prism and said relay optical system.

22. An apparatus according to claim 21, wherein a slit having a plurality of openings is disposed on the incident surface of said wedge-shaped prism.

23. An apparatus according to claim 22, wherein: said projection pattern comprises bright and dark fringes having a predetermined pitch;

a vibration mirror is disposed on said optical path between said wafer and said incident surface of said wedge-shaped prism; and the vibration mirror is vibrated in such a way that an image of said fringes scanningly moves on said wedge-shaped prism in a pitch direction of said fringes.

24. An apparatus according to claim 21, wherein said condensing optical system is a both side telecentric optical system.

25. A method for detecting a position of a surface to be detected, comprising:

illuminating a projection pattern;

forming an image of the illuminated projection pattern on said surface through a projection optical system having a first optical axis which is inclined with respect to said surface to be detected;

re-forming said image on an incident surface of a wedge-shaped prism, through a condensing optical system having a second optical axis which is inclined with respect to said surface to be detected;

refracting light from the re-formed image through said wedge-shaped prism;

guiding refracted light from said wedge-shaped prism to a relay optical system;

guiding light through said relay optical system to a light-receiving surface of a detector system;

and again re-forming said image on the light-receiving surface of said detector system;

wherein said projection pattern and said surface to be detected are arranged to satisfy a Scheimpflug condition in association with a principal plane of said projection optical system;

said surface to be detected and said incident surface of said wedge-shaped prism are arranged to satisfy a Scheimpflug condition in association with a principal plane of said condensing optical system; and said incident surface of the wedge-shaped prism and the light-receiving surface of said detector system are conjugate with respect to said relay optical system.

26. A method for transferring an image of reticle onto a wafer placed on a wafer stage, comprising:

illuminating a projection pattern;

forming an image of said illuminated projection pattern on a surface of said wafer through a projection optical system having a first optical axis which is inclined with respect to said wafer surface;

re-forming said image on an incident surface of a wedge-shaped prism through a condensing optical system having a second optical axis which is inclined with respect to said wafer surface;

refracting light from the re-formed image through said wedge-shaped prism;

guiding refracted light from said wedge-shaped prism to a relay optical system;

guiding light through said relay optical system to a light-receiving surface of a detector system;

again re-forming said image on the light-receiving surface of said detector system;

calculating a difference between said wafer surface and a predetermined reference surface;

driving said wafer stage based on a result of the calculating; and illuminating the reticle so as to form an image of the reticle on the wafer;

wherein said projection pattern and said wafer are arranged to satisfy a Scheimpflug condition in association with a principal plane of said projection optical system;

said wafer and said incident surface of said wedge-shaped prism are arranged to satisfy a Scheimpflug condition in association with a principal plane of said condensing optical system; and said incident surface of the wedge-shaped prism and the light-receiving surface of said detector system are conjugate with respect to said relay optical system.

* * * * *